(12) United States Patent
Kim et al.

(10) Patent No.: US 12,207,537 B2
(45) Date of Patent: Jan. 21, 2025

(54) DISPLAY DEVICES AND MANUFACTURING METHOD THEREOF

(71) Applicant: Samsung Display Co., Ltd., Yongin-Si (KR)

(72) Inventors: Kwang Nyun Kim, Cheonan-si (KR); Ki Chul Bae, Asan-si (KR); Jong Gil Ryu, Gwangmyeong-si (KR); Seung Min Lee, Hwaseong-si (KR); Chang Yong Lee, Cheonan-si (KR); Chul Kyu Choi, Asan-si (KR); In Huh, Seongnam-si (KR); Jong Hak Hwang, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 1163 days.

(21) Appl. No.: 16/871,128

(22) Filed: May 11, 2020

(65) Prior Publication Data

US 2021/0028362 A1    Jan. 28, 2021

(30) Foreign Application Priority Data

Jul. 22, 2019    (KR) .................. 10-2019-0088330

(51) Int. Cl.
*H10K 71/80*    (2023.01)
*B32B 7/12*    (2006.01)
(Continued)

(52) U.S. Cl.
CPC .............. *H10K 71/80* (2023.02); *B32B 7/12* (2013.01); *B32B 27/08* (2013.01); *B32B 27/281* (2013.01);
(Continued)

(58) Field of Classification Search
CPC . B32B 2457/20; B32B 2307/732; B32B 7/12; B32B 27/08; B32B 27/281;
(Continued)

(56) References Cited

U.S. PATENT DOCUMENTS 9,276,047 B2 *    3/2016    Ko .................... H10K 59/88
9,356,256 B2    5/2016    Choi
(Continued)

FOREIGN PATENT DOCUMENTS

CN    107492556 A    12/2017
CN    107492598 A    12/2017
(Continued)

OTHER PUBLICATIONS

Chinese Office Action corresponding to Application No. 202010706274.8 and issued on May 10, 2024, 6 pages.

*Primary Examiner* — Caleen O Sullivan
(74) *Attorney, Agent, or Firm* — Innovation Counsel LLP

(57) ABSTRACT

An embodiment of the present inventive concept provides a display device including: a mother substrate on which a plurality of display modules are located; and a mother film located on a rear surface of the mother substrate, wherein the mother film may include a first layer, and a second layer disposed between the first layer and the mother substrate, the second layer has a thickness of from about 40 μm to about 60 μm, and a thickness of the first layer may be greater than that of the second layer.

8 Claims, 23 Drawing Sheets

(51) Int. Cl.
  *B32B 27/08*   (2006.01)
  *B32B 27/28*   (2006.01)
  *B32B 27/36*   (2006.01)
  *B32B 37/02*   (2006.01)
  *B32B 37/12*   (2006.01)
  *B32B 38/00*   (2006.01)
  *B32B 43/00*   (2006.01)
  *H10K 59/12*   (2023.01)
  *H10K 59/88*   (2023.01)
  *H10K 71/00*   (2023.01)
  *H10K 77/10*   (2023.01)
  *H10K 102/00*  (2023.01)

(52) U.S. Cl.
  CPC .............. *B32B 27/36* (2013.01); *B32B 37/02* (2013.01); *B32B 37/12* (2013.01); *B32B 38/0004* (2013.01); *B32B 43/006* (2013.01); *H10K 59/12* (2023.02); *H10K 59/88* (2023.02); *H10K 71/00* (2023.02); *H10K 77/111* (2023.02); *B32B 2367/00* (2013.01); *B32B 2379/08* (2013.01); *B32B 2457/20* (2013.01); *H10K 59/1201* (2023.02); *H10K 71/851* (2023.02); *H10K 2102/311* (2023.02)

(58) Field of Classification Search
  CPC ......... B32B 27/36; B32B 37/02; B32B 37/12; B32B 38/0004; B32B 43/006; B32B 2367/00; B32B 2379/08; H10K 59/1201; H10K 71/851; H10K 2102/311; H10K 71/80; H10K 59/12; H10K 59/88; H10K 71/00; H10K 77/111; Y02E 10/549; Y02P 70/50; H01L 21/6836; H01L 2221/68354; H01L 27/156; H01L 21/02118; H01L 21/78; H01L 24/03; H01L 24/06; H01L 24/27; H01L 24/30

USPC ........................................................ 438/33
  See application file for complete search history.

(56)    References Cited

U.S. PATENT DOCUMENTS

| | | |
|---|---|---|
| 10,056,568 B2 | 8/2018 | Min et al. |
| 10,340,316 B2 | 7/2019 | Lee et al. |
| 10,553,802 B2 | 2/2020 | Min et al. |
| 10,559,631 B2 | 2/2020 | Lee et al. |
| 10,686,161 B2 | 6/2020 | Kang et al. |
| 11,031,565 B2 | 6/2021 | Min et al. |
| 11,217,769 B2 | 1/2022 | Kishimoto et al. |
| 11,476,449 B2 | 10/2022 | Kang et al. |
| 11,711,964 B2 | 7/2023 | Min et al. |
| 11,943,968 B2 | 3/2024 | Kang et al. |
| 2014/0091288 A1 | 4/2014 | Lee et al. |
| 2016/0107425 A1* | 4/2016 | Forier ..................... B32B 27/08 428/354 |
| 2017/0005291 A1 | 1/2017 | Sung et al. |
| 2017/0358762 A1* | 12/2017 | Min ..................... H10K 71/00 |
| 2022/0238839 A1 | 7/2022 | Kishimoto et al. |

FOREIGN PATENT DOCUMENTS

| | | |
|---|---|---|
| KR | 10-2013-0072651 A | 7/2013 |
| KR | 10-2014-0043022 A | 4/2014 |
| KR | 10-2014-0087884 A | 7/2014 |
| KR | 10-2014-0142026 A | 12/2014 |
| KR | 10-2015-0016053 A | 2/2015 |
| KR | 10-2016-0013486 A | 2/2016 |
| KR | 10-20170092748 A | 8/2017 |
| KR | 10-2018-0011411 A | 2/2018 |
| KR | 10-2018-0018972 A | 2/2018 |

* cited by examiner

DISPLAY DEVICES AND MANUFACTURING METHOD THEREOF

CROSS-REFERENCE TO RELATED APPLICATION

This application claims priority to and the benefit of Korean Patent Application No. 10-2019-0088330 filed in the Korean Intellectual Property Office on Jul. 22, 2019, the entire contents of which are incorporated herein by reference.

BACKGROUND

(a) Technical Field

The present disclosure relates to a display device and a manufacturing method thereof, and more particularly, to a display device and a manufacturing method thereof that may reduce occurrence of bubbles during a process of adhering a film to a rear surface of a substrate.

(b) Description of the Related Art

Recently, a light emitting diode display as a self-emission display device has attracted attention as a device for displaying an image.

Because the light emitting diode display has a self-emission characteristic and does not require an additional light source, unlike a liquid crystal display device, it is possible to reduce thickness and weight thereof. Further, the light emitting diode display has high-quality characteristics such as low power consumption, high luminance, and high response speed.

Generally, the light emitting diode display includes a substrate, a plurality of thin film transistors disposed on the substrate, a plurality of insulating layers disposed between wires included in the thin film transistors, and a light emitting diode connected to the thin film transistors.

Such a light emitting diode display may be manufactured through a process of forming a plurality of display devices on one substrate and then cutting them into individual display device units. Recently, a flexible display device has attracted attention, and thus, a flexible substrate such as polyimide is also used. In this case, in order to ensure stability of the substrate during the manufacturing process, a film or the like may be attached to a rear surface of the substrate.

The above information disclosed in this Background section is only for enhancement of understanding of the background of the inventive concept, and therefore it may contain information that does not form the prior art that is already known in this country to a person of ordinary skill in the art.

SUMMARY

Embodiments have been made in an effort to provide a display device and a manufacturing method thereof that may reduce occurrence of bubbles during a process of adhering a film to a rear surface of a substrate.

An embodiment of the present inventive concept provides a display device including: a mother substrate on which a plurality of display modules are located; and a mother film located on a rear surface of the mother substrate, wherein the mother film may include a first layer and a second layer disposed between the first layer and the mother substrate, the second layer has a thickness of from about 40 μm to about 60 μm, and a thickness of the first layer may be greater than that of the second layer.

The second layer may include a pressure sensitive adhesive.

The first layer may include polyethylene terephthalate (PET).

The first layer may have a thickness of from about 60 μm to about 90 μm.

The substrate may be a flexible substrate including polyimide.

Another embodiment of the present inventive concept provides a manufacturing method of a display device, including: preparing a substrate including a plurality of display modules; and attaching a mother film to a rear surface of the substrate, wherein the mother film may include a first layer and a second layer disposed between the first layer and the mother substrate, and the second layer may have a thickness of from about 40 μm to about 60 μm.

The second layer may include a pressure sensitive adhesive.

The first layer may include polyethylene terephthalate (PET).

The first layer may have a thickness of from about 60 μm to about 90 μm.

A thickness of the first layer may be greater than that of the second layer.

The manufacturing method of the display device may further include cutting the plurality of display modules into individual display modules, and eliminating the mother film.

Another embodiment of the present inventive concept provides a manufacturing method of a display device, including: preparing a substrate including a plurality of display modules and a plurality dummy patterns disposed between the plurality of display modules; and cutting the substrate along a cutting line and separating the substrate into individual display modules, wherein the plurality of dummy patterns may be disposed along a direction parallel to the cutting line, and each of the plurality of dummy patterns may be provided with a groove disposed along a direction perpendicular to the cutting line.

Each of the plurality of dummy patterns may include a first organic film and a second organic film disposed on the first organic film, and the second organic film may be partially removed along a direction perpendicular to the cutting line.

The manufacturing method of the display device may further include an alignment mark disposed on the substrate, wherein the second organic film on the align mark is removed.

The first organic film and the second organic film may be removed in a direction perpendicular to the cutting line.

The plurality of dummy patterns may not overlap the cutting line.

The plurality of dummy patterns may overlap the cutting line.

The preparing of the substrate including the plurality of display modules and the plurality of dummy patterns disposed between the display modules may include: preparing a mother substrate including a plurality of display modules; and attaching a mother film to a rear surface of the mother substrate, wherein the mother film may include a first layer and a second layer disposed between the first layer and the mother substrate, while the second layer may include a pressure-sensitive adhesive (PSA), and a thickness of the second layer may be from about 40 μm to about 60 μm.

The manufacturing method of the display device may further include, after the cutting of the substrate along the cutting line to separate the substrate into individual display modules, eliminating the mother film, and attaching a protective layer to a rear surface of the substrate.

According to the embodiments, a display device and a manufacturing method thereof that may reduce occurrence of bubbles during a process of adhering a film to a rear surface of a substrate, are provided.

DETAILED DESCRIPTION OF THE EMBODIMENTS

Figure 1:
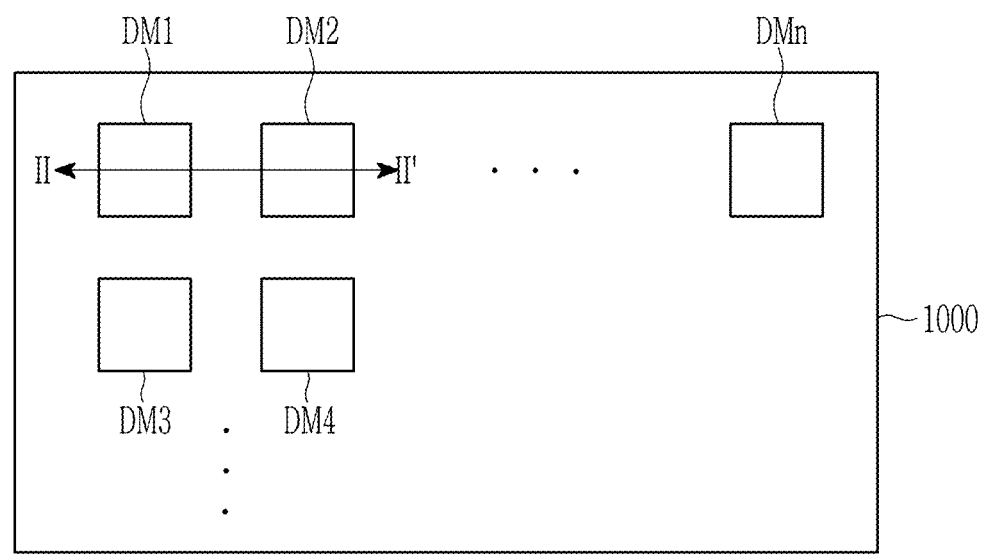
FIG. 1 illustrates a display device according to an embodiment of the present inventive concept.

The present inventive concept will be described more fully hereinafter with reference to the accompanying drawings, in which embodiments of the inventive concept are shown. As those skilled in the art would realize, the described embodiments may be modified in various different ways, all without departing from the spirit or scope of the present disclosure.

Parts that are irrelevant to the description will be omitted to clearly describe the present disclosure, and like reference numerals designate like elements throughout the specification.

Further, in the drawings, the size and thickness of each element are arbitrarily illustrated for ease of description, and the present disclosure is not necessarily limited to those illustrated in the drawings. In the drawings, the thicknesses of layers, films, panels, regions, etc., are exaggerated for clarity. In the drawings, for ease of description, the thicknesses of some layers and areas are exaggerated.

It will be understood that when an element such as a layer, film, region, or substrate is referred to as being "on" another element, it can be directly on the other element or intervening elements may also be present. In contrast, when an element is referred to as being "directly on" another element, there are no intervening elements present. Further, in the specification, the word "on" or "above" means positioned on or below the object portion, and does not necessarily mean positioned on the upper side of the object portion based on a gravitational direction.

In addition, unless explicitly described to the contrary, the word "comprise" and variations such as "comprises" or "comprising" will be understood to imply the inclusion of stated elements but not the exclusion of any other elements.

Further, throughout the specification, the phrase "in a plan view" means viewing a target portion from the top, and the phrase "in a cross-sectional view" means viewing a cross-section formed by vertically cutting a target portion from the side.

Hereinafter, a display device and a manufacturing method thereof according to an embodiment of the present inventive concept will be described in detail with reference to the accompanying drawings. The present inventive concept may solve a problem that bubbles occur during a process of adhering a film to a lower portion of a substrate in a display device and in a manufacturing process thereof.

FIG. 1 illustrates a display device according to an embodiment of the present inventive concept. The display device according to the embodiment of FIG. 1 includes a plurality of display modules (DM1, DM2, DM3, . . . , DMn) disposed on a mother substrate 1000. That is, FIG. 1 illustrates the display device including the plurality of display modules (DM1, DM2, DM3, . . . , DMn) that may separately operate, and the display device may later be cut into individual display modules to function as respective display devices. The mother substrate 1000 may be a flexible substrate including polyimide.

Figure 2:
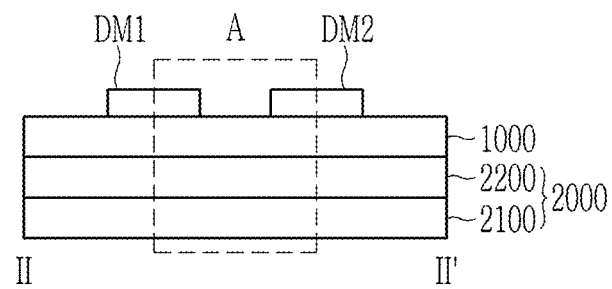
FIG. 2 illustrates a cross-sectional view taken along line II-II' of FIG. 1.

FIG. 2 illustrates a cross-sectional view taken along line II-II' of FIG. 1. Referring to FIG. 2, the display device according to the present embodiment includes a mother film 2000 disposed under the mother substrate 1000. The mother film 2000 includes a first layer 2100 and a second layer 2200. The second layer 2200 may be disposed between the first layer 2100 and the mother substrate 1000.

The first layer 2100 may include polyethylene terephthalate (PET). In addition, the second layer 2200 may include a pressure sensitive adhesive (PSA). The PSA of the second layer 2200 adheres the first layer 2100 to the mother substrate 1000.

The mother film 2000 may be removed after the display device including the plurality of display modules is cut into individual display modules.

In the present inventive concept, a thickness of the first layer 2100 may be 60 μm to 90 μm, and a thickness of the second layer 2200 may be 40 μm to 60 μm. In the present inventive concept, the thickness of the first layer 2100 may be greater than that of the second layer 2200. When the thickness of the second layer 2200 is greater than that of the first layer 2100, a problem may occur in which an upper protective film 3000 is broken while the mother film 2000 is removed. In addition, an upper structure of the mother substrate 1000 may be damaged during the removing process of the mother film 2000.

In the present inventive concept, the second layer 2200 including the PSA has a thickness of 40 µm to 60 µm. Therefore, because the second layer 2200 has a sufficient thickness to be able to suppress occurrence of bubbles therein, the problem that the bubbles occur in the manufacturing process of the display device may be improved. Hereinafter, an effect of the present inventive concept together with the manufacturing process of the display device will be described in detail.

A manufacturing method of a display device according to an embodiment of the present inventive concept includes preparing a substrate including a plurality of display modules, and attaching the mother film 2000 to a rear surface of the substrate. The mother film 2000 includes the first layer 2100, and the second layer 2200 disposed between the first layer 2100 and the substrate 1000. The second layer 2200 may include the PSA, and its thickness may be from about 40 µm to about 60 µm. Thereafter, the manufacturing method may further include cutting the plurality of display modules into individual display modules and removing the mother film 2000.

That is, in the display device and the manufacturing method thereof according to the present inventive concept, because the mother film 2000 includes the second layer 2200 that has a multilayer structure, includes the PSA, and has a thickness of from about 40 µm to about 60 µm, it is possible to improve the problem that the bubbles occur during the manufacturing process of the display device.

Hereinafter, an effect of the present inventive concept will be described in detail with reference to the accompanying drawings.

Figure 3:
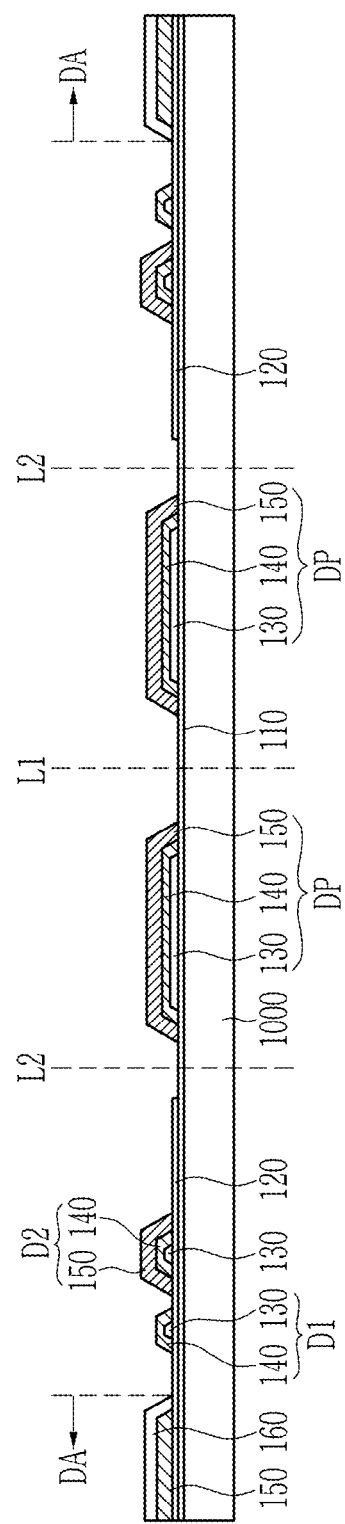
FIG. 3 illustrates an enlarged view of a portion indicated by area A of FIG. 2 in detail.

FIG. 3 illustrates an enlarged view of a portion indicated by area A of FIG. 2 in detail. Referring to FIG. 3, a first inorganic film 110, a second inorganic film 120, an intermediate film 130, a first organic film 140, a second organic film 150, and a thin film encapsulation layer 160 are disposed on the mother substrate 1000. In FIG. 3, the structures of the inorganic films and the organic films are mainly shown, but a structure that is not shown may be further included.

Referring to FIG. 3, a display area DA, dams D1 and D2, and a dummy pattern DP are disposed on the mother substrate 1000 between adjacent individual display modules. The display area DA includes a display module and displays an image. Types of films stacked in the display area DA, the dams D1 and D2, and the dummy pattern DP may be different from each other, as shown in FIG. 3.

Referring to FIG. 3, the mother substrate 1000 is cut along a first cutting line L1 during a first cut. Thereafter, the cut mother substrate is cut along a second cutting line L2 during a second cut. That is, only one display area DA is disposed in the cut mother substrate through the first cut along the first cutting line L1, and the dummy pattern DP is eliminated through the second cut along the second cutting line L2.

Recently, in the display device, a bezel size has been reduced, and the display area has been gradually increased. In addition, because many display modules are prepared on one mother substrate 1000 during a manufacturing process for cost reduction, a distance between the display modules in the mother substrate 1000 is shortened. This means that distances between the first and second cutting lines L1 and L2 and the display area DA are shortened, and thus, bubbles are easily formed on the rear surface of the mother substrate 1000, and the bubbles are not easily eliminated. The bubbles on the rear surface of the mother substrate 1000 are formed during the process of attaching the mother film 2000 to the mother substrate 1000.

Figure 4:
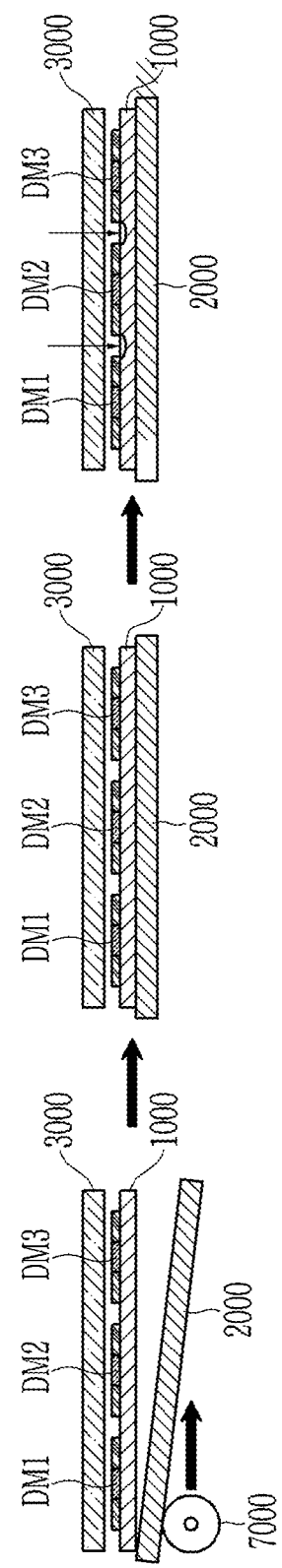
FIG. 4 illustrates a manufacturing process of a general display device.

FIG. 4 illustrates a manufacturing process of a general display device. Referring to FIG. 4, a plurality of display modules DM1, DM2, and DM3 are disposed on the mother substrate 1000, and then the upper protective film 3000 is disposed thereon.

The mother film 2000 is attached to a lower side of the mother substrate 1000. The mother film 2000 is a film attached in a manufacturing process, and it may be removed in a final display device. The mother film 2000 may be attached by using a roller 7000. In the manufacturing process, it takes some time until cutting the mother film 2000 after attaching it to the display device. The waiting time varies depending on the manufacturing process, and it may be as short as 8 hours and as long as 100 hours or more. During the waiting time, the mother film 2000 lifts from the mother substrate 1000 to generate bubbles. In FIG. 4, the bubbles are generated between adjacent display modules which is indicated by an arrow.

However, the display device and the manufacturing method thereof according to the present embodiment prevent the formation of bubbles by setting the thickness of the second layer 2200 including the PSA from about 40 µm to about 60 µm.

Figure 5:
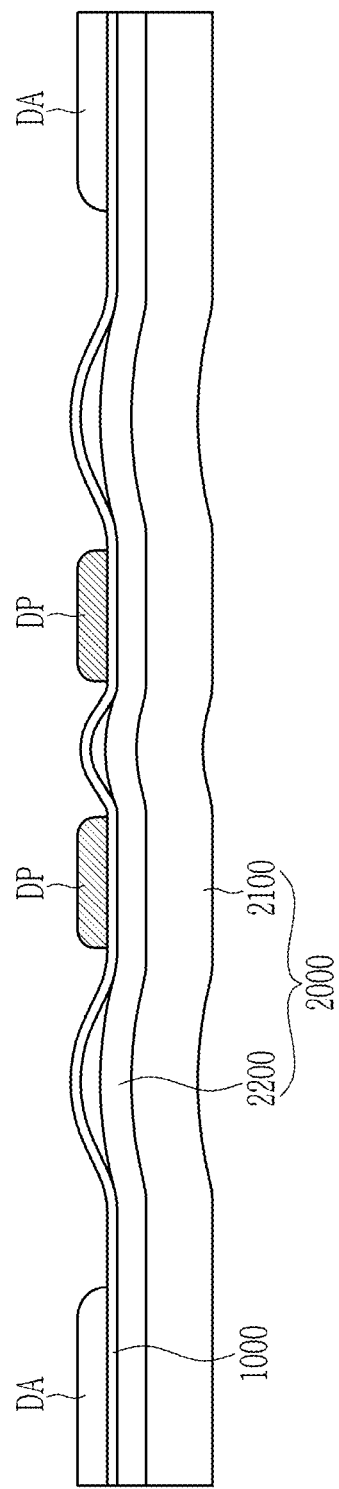
FIG. 5 and FIG. 6 illustrate a principle in which bubbles occur in a display device including a second layer having a thickness of 25 μm.
Figure 6:
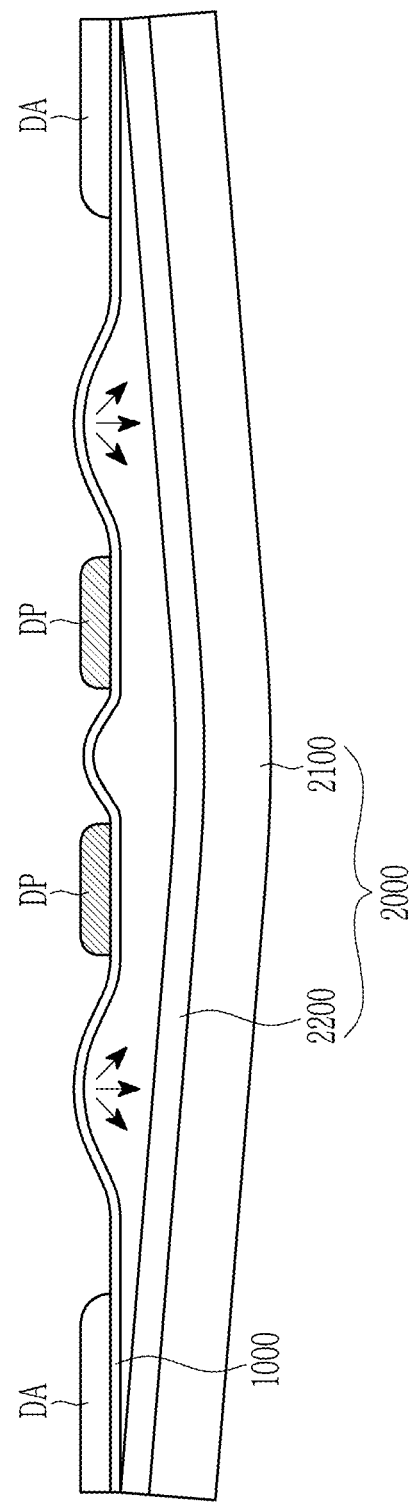

FIG. 5 and FIG. 6 illustrate a principle in which bubbles occur in a display device according to a comparative example including the second layer 2200 having a thickness of about 25 µm. Referring to FIG. 5, the mother film 2000 is attached to the display device by using a roller. Therefore, the mother substrate 1000 of the display device is pressed by a round surface of the roller, and is bent. This is because the mother substrate 1000 is a flexible substrate including a flexible material such as polyimide.

In a case in which the mother film 2000 is attached to the bent mother substrate 1000, when the thickness of the second layer 2200 serving as an adhesive is not sufficiently thick, the mother film 2000 is lifted at the bent portion of the mother substrate 1000 and bubbles are formed at the bent portion of the mother substrate 1000 which are indicated by an arrow.

FIG. 6 illustrates a cross-section of the display device in which the bubbles are formed. Referring to FIG. 6, bubbles occur when the mother substrate 1000 and the mother film 2000 are separated from each other at the bent portion of the mother substrate 1000.

Figure 7:
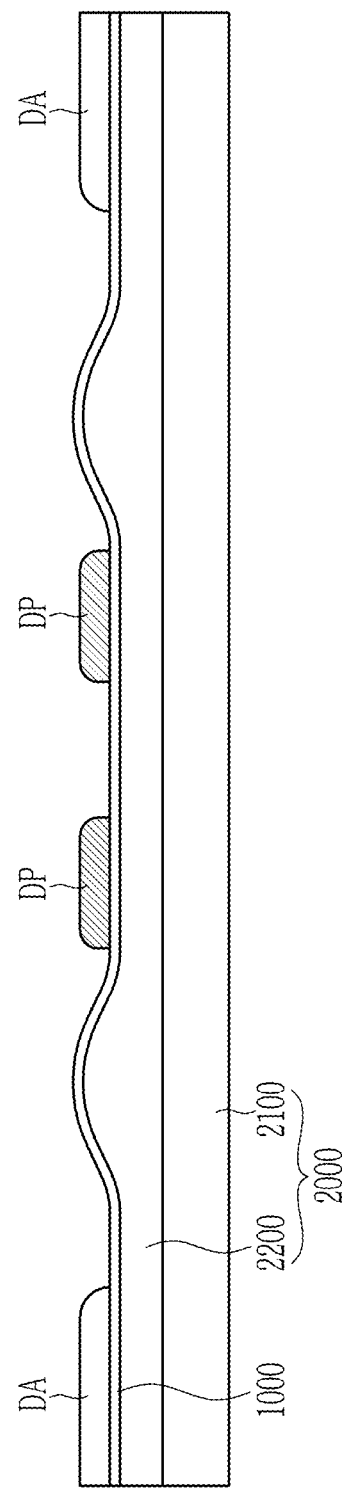
FIG. 7 illustrates a cross-sectional view of a display device according to an embodiment of the present inventive concept, which is the same as those of FIG. 5 and FIG. 6.

FIG. 7 illustrates a cross-sectional view of a display device according to an embodiment of the present inventive concept, which is the same portion as those of FIG. 5 and FIG. 6. Referring to FIG. 7, in the display device according to the present embodiment, the thickness of the second layer 2200 of the mother film 2000 is from about 40 µm to about 60 µm, which is thicker than that of the comparative example.

Accordingly, as shown in FIG. 7, as the second layer 2200 fills the curved surface of the mother substrate 1000 without gap dispose between the mother substrate 1000 and the mother film 2000, the mother substrate remains attached. Therefore, it is possible to prevent the lifting of the mother film 2000 on the curved surface of the mother substrate 1000, and to suppress the occurrence of bubbles. In addition, as the thickness of the second layer 2200 increases, adhesive force also increases, and thus the mother substrate 1000 and the mother film 2000 are more strongly attached to each other and are not separated.

A bubble-occurring rate between the mother substrate 1000 and the mother film including the PSA was measured, and is shown in Table 1.

Figure 8:
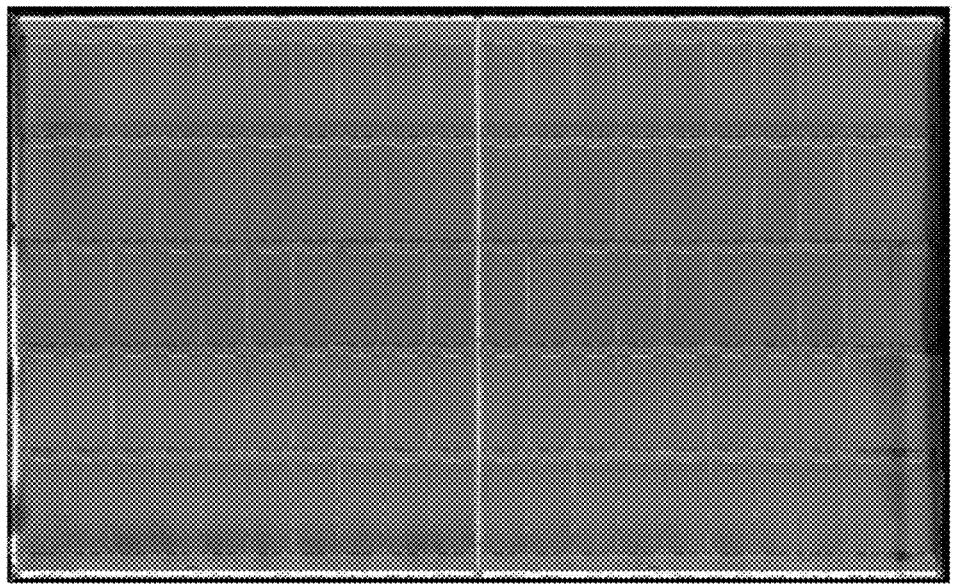
FIG. 8 illustrates a result of an experiment according to Example 1.

In Example 1, the thickness of the first layer 2100 including PET was about 75 μm and the thickness of the second layer 2200 including the PSA was about 50 μm. A bubble defect rate was measured after 32 hours had elapsed after the mother film 2000 was attached to the mother substrate 1000. FIG. 8 illustrates a result of an experiment according to Example 1.

TABLE 1

|  | Example 1 | |
| --- | --- | --- |
| Stagnation time | 32 h | 100 h |
| Thickness of film layer (μm) (PET/PSA) | 75/50 | 75/50 |
| Mother panel bubble defect rate | Not occurring 0% (0/46 substrate) | Not occurring 0% (0/46 substrate) |

The measurement of the bubble defect rate was calculated by the number of substrates in which bubbles occurred among test target substrates. In Example 1 in which the thickness of the second layer 2200 containing the PSA was about 50 μm, the phenomenon of bubble occurrence after 32 hours was improved. That is, in Example 1, no bubbles were observed in any of the 46 substrates. Referring to FIG. 8, it was confirmed that almost no bubbles were formed in the display device. Referring back to Table 1, in the display device according to Example 1, no bubbles were observed even after 100 hours had elapsed, and it was confirmed that the phenomenon of bubble occurrence was improved.

That is, the display device and the manufacturing method thereof according to the present embodiment have the increased thickness of the second layer 2200 including the PSA in the mother film 2000, so that the adhesive force between the mother substrate 1000 and the mother film 2000 is increased, and the second layer 2200 completely fills the curved portion of the mother substrate 1000. Accordingly, it is possible to prevent the occurrence of bubbles between the mother substrate 1000 and the mother film 2000.

Hereinafter, a manufacturing method of a display device according to another embodiment of the present inventive concept will be described. The display device and the manufacturing method thereof that are previously described relate to a mother substrate in which a plurality of display modules are formed on one substrate, and the manufacturing method of the display device according to the present embodiment includes a process of cutting the mother substrate on which the plurality of display modules are located into individual display modules.

That is, the manufacturing method of the display device according to the present embodiment includes preparing a substrate which includes a plurality of display modules and dummy patterns disposed between the display modules in a plan view and cutting the substrate along a cutting line to separate the substrate into individual display modules, wherein the dummy pattern is disposed along the cutting line, and a groove in which a second organic film 150 is eliminated in the dummy pattern is positioned in a direction perpendicular to the cutting line.

Thereafter, the manufacturing method may further include forming a protective layer on the rear surface of the substrate. Bubbles occurring in the forming of the protective layer may be easily eliminated in the direction of the cutting line through the groove located in the dummy pattern.

In the present embodiment, the substrate prepared in the preparing of the substrate including the plurality of display modules may be the substrate manufactured according to the manufacturing method of the foregoing embodiment. That is, the substrate prepared in the preparing of the substrate including the plurality of display modules may be a substrate manufactured by preparing the mother substrate 1000 including the plurality of display modules and attaching the mother film 2000 to the rear surface of the mother substrate 1000.

In this case, the mother film 2000 may include the first layer 2100 and the second layer 2200 disposed between the first layer 2100 and the substrate 1000, and the second layer 2200 may include the PSA and have a thickness of from about 40 μm to about 60 μm.

Bubbles may not be formed on the rear surface of the substrate including the plurality of display modules manufactured in this manner. However, even though the mother substrate is prepared without bubbles in the rear surface thereof, bubbles may be formed when the protective layer is attached after the mother substrate is cut into individual substrates. The manufacturing method of the display device according to the present embodiment prevents bubbles occurring in the process of attaching the protective layer after cutting the mother substrate into individual substrates.

Figure 9:
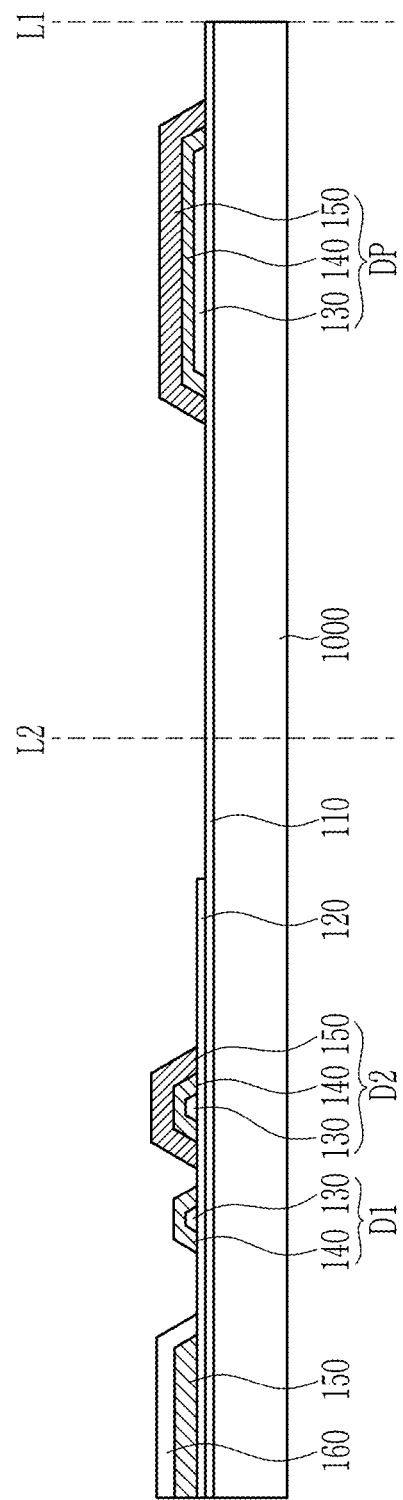
FIG. 9 and FIG. 10 illustrate a process of cutting the display device of FIG. 3, respectively.
Figure 10:
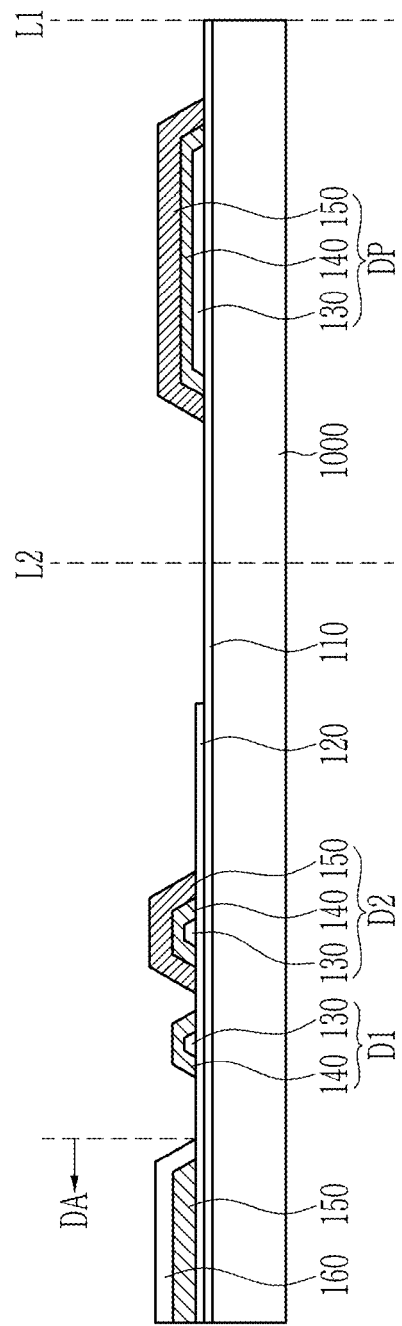

FIG. 9 and FIG. 10 respectively illustrate a process in which the display device of FIG. 3 is cut. FIG. 9 illustrates a cross-sectional view of a general display device cut along the first cutting line L1 of FIG. 3. Then, it is cut along the second cutting line L2. In this case, in FIG. 9, because a structure such as the dummy pattern DP is not disposed near the second cutting line L2, the bubbles occurring when the protective layer is attached to the rear surface of the substrate 1000 may be eliminated.

However, recently, because the size of a bezel of a display device is minimized, a cross-section as shown in FIG. 10 is provided. Referring to FIG. 10, the dummy pattern DP is disposed near the second cutting line L2. Therefore, a passage through which bubbles can be removed is formed when the protective layer is attached to the rear surface. That is, the bubble-eliminating passage is blocked by the dummy pattern DP, and thus the bubbles are not easily eliminated. This is because, although the dummy pattern DP corresponds to a structure positioned on the substrate 1000 and the protective layer corresponds to a structure attached to the rear surface of the substrate, contact properties between the protective layer on the rear surface of the substrate and the substrate are affected by the structure on the substrate 1000. Therefore, by changing a design of a structure of an upper surface of the substrate 1000, it is possible to eliminate the bubbles in the protective layer located on the rear surface of the substrate.

Figure 11:
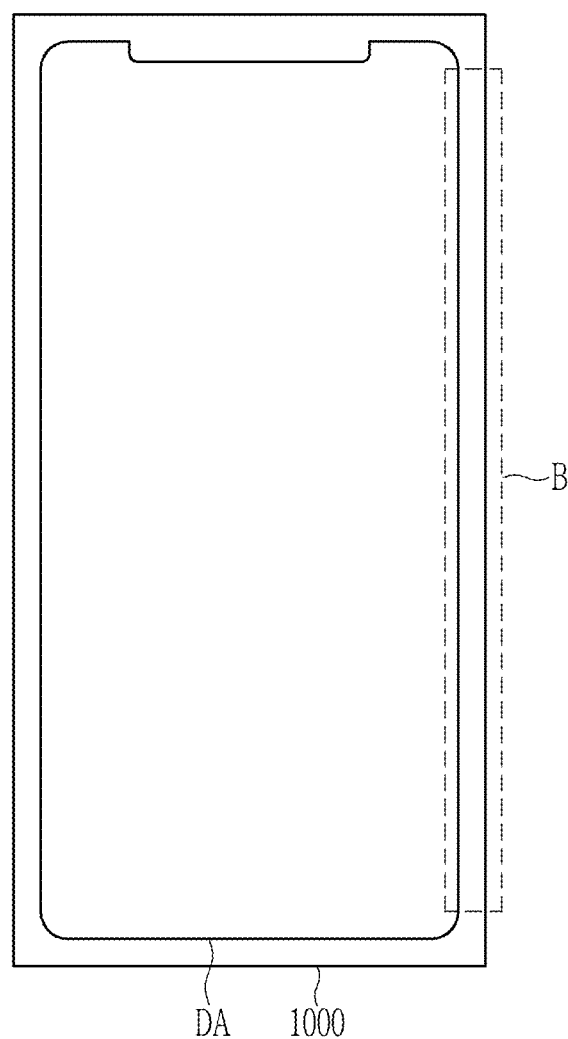
FIG. 11 illustrates a region where bubbles occur in a display device cut to include one display module.

FIG. 11 illustrates a region where bubbles occur in a display device which is cut to include one display module. An area indicated by 'B' in FIG. 11 is an area where bubbles are prone to occur.

Figure 12:
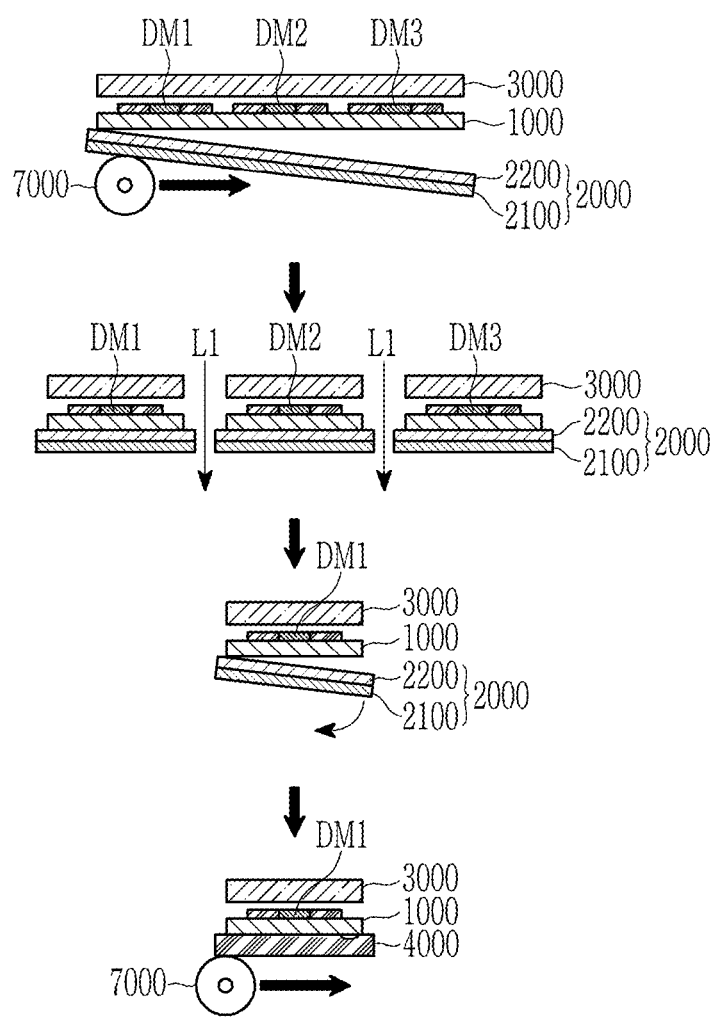
FIG. 12 schematically illustrates a manufacturing method of a display device according to an embodiment.

FIG. 12 schematically illustrates a manufacturing method of a display device according to an embodiment. Referring to FIG. 12, the mother film 2000 on which the plurality of display modules DM1, DM2, and DM3 are disposed is first attached to the rear surface of the mother substrate 1000. The upper protective film 3000 is formed on the plurality of display modules DM1, DM2, and DM3.

The mother film 2000 may be attached by roll lamination using the roller 7000, and the mother film 2000 may include the first layer 2100 and the second layer 2200. The first layer 2100 may include PET and have a thickness of from about 60 μm to about 90 μm, and the second layer 2200 may include the PSA and may have a thickness of from about 40 μm to about 60 μm.

Next, referring to FIG. 12, the mother substrate 1000 is cut to separate the plurality of display modules into individual display modules.

Then, the mother film 2000 under the mother substrate 1000 is removed.

Subsequently, a protective layer 4000 is attached on the rear surface of the substrate 1000 from which the mother film 2000 is removed. In this case, the protective layer 4000 may be of a film type, and may be attached by roll lamination using the roller 7000. Bubbles may be formed in the process of attaching the protective layer 4000 on an alignment mark of the display device, thereby obstructing a subsequent alignment process.

Thus, the manufacturing method of the display device according to the present embodiment is a manufacturing method that may easily eliminate bubbles occurring when the protective layer 4000 is attached.

Figure 13:
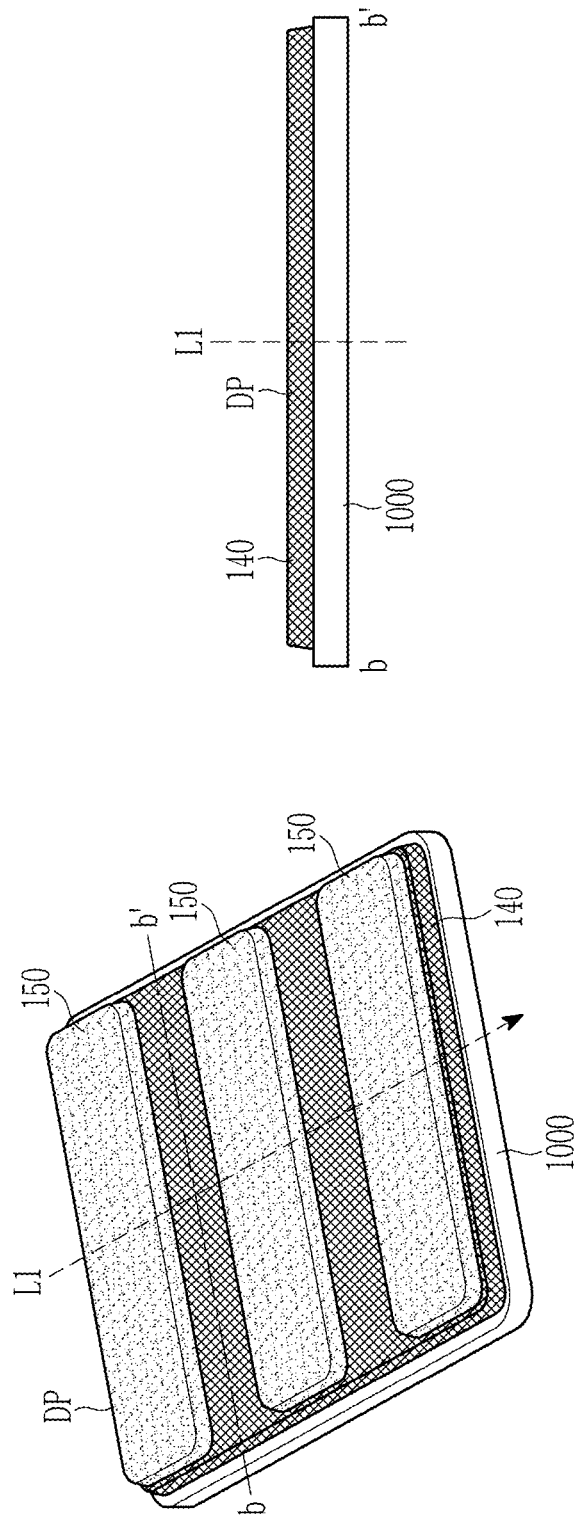
FIG. 13 illustrates a top plan view and a cross-sectional view near a cutting line L1 in a display device according to an embodiment of the present inventive concept.

FIG. 13 illustrates a display device according to an embodiment of the present inventive concept. Referring to FIG. 13, the dummy pattern DP which includes an inorganic film 120, an intermediate film 130, a first organic film 140 and a second organic film 150 is disposed to overlap the cutting line L1. In this case, a portion of the second organic film 150 is removed along a direction b-b' extending perpendicular to the cutting line L1 to expose the first organic film 140. A valley is formed between adjacent second organic films 150.

Figure 14:
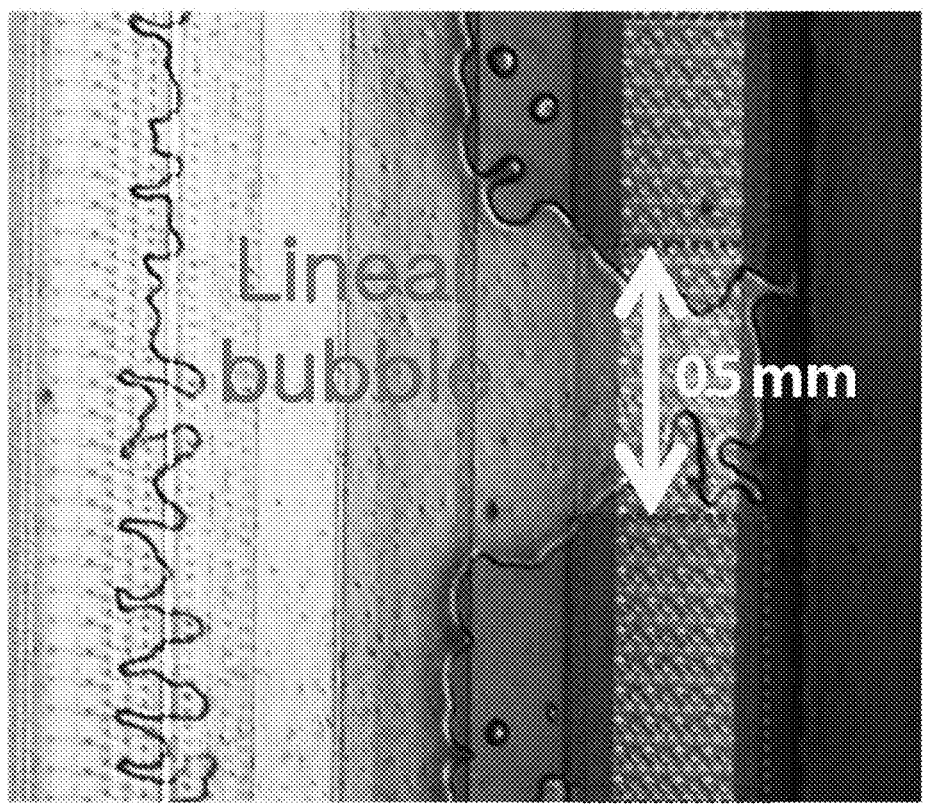
FIG. 14 illustrates an image near a cut plane of the display device according to the embodiment of FIG. 13.

The bubbles may be discharged through the valley. FIG. 14 illustrates an image near a cutting line of the display device according to the embodiment of FIG. 13. Referring to FIG. 14, the valley is indicated by an arrow. In the present embodiment, a width of the valley is about 0.5 mm. As can be seen in FIG. 13, the bubbles near the cutting line may be discharged through the valley.

Figure 15:
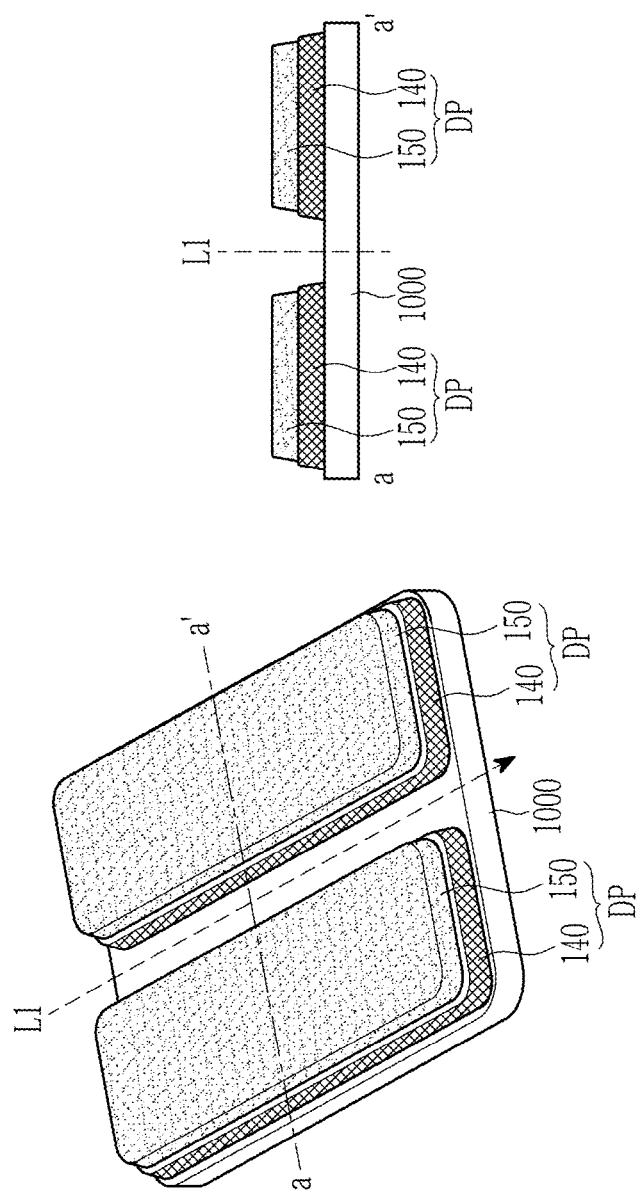
FIG. 15 illustrates the same area as FIG. 13 in another embodiment of the present inventive concept.

FIG. 13 illustrates a structure in which the first organic film 140 which is disposed under the second organic film 140 is not removed, but in another embodiment, the first organic film 140 may also be removed. That is, as shown in FIG. 15, when the first organic film 140 is removed, the bubbles may be well discharged through a valley formed by removing the second organic film 150 and the first organic film 140.

Figure 16:
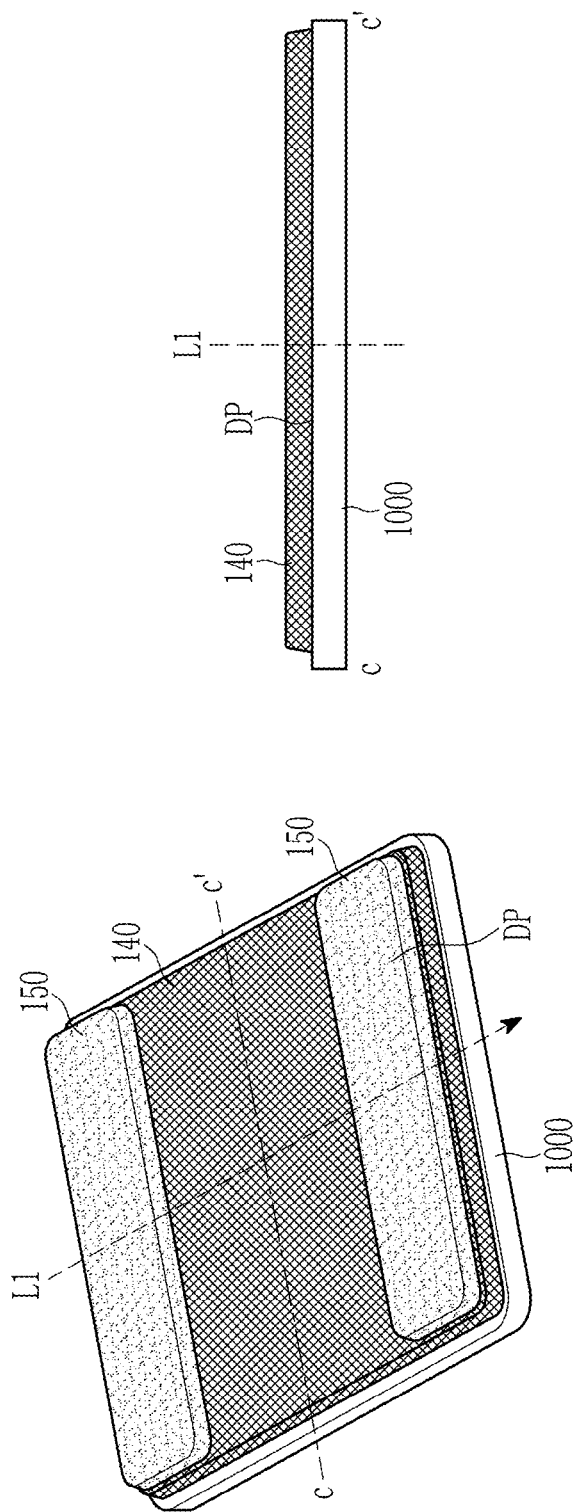
FIG. 16 illustrates the same area as FIG. 13 in another embodiment of the present inventive concept.

FIG. 16 illustrates the same area as FIG. 13 in another embodiment of the present inventive concept. Referring to FIG. 16, the display device according to the present embodiment is the same as the display device of FIG. 13, except that an area in which the second organic film 150 is eliminated is larger than that in FIG. 13. A detailed description of the same components will be omitted.

Figure 17:
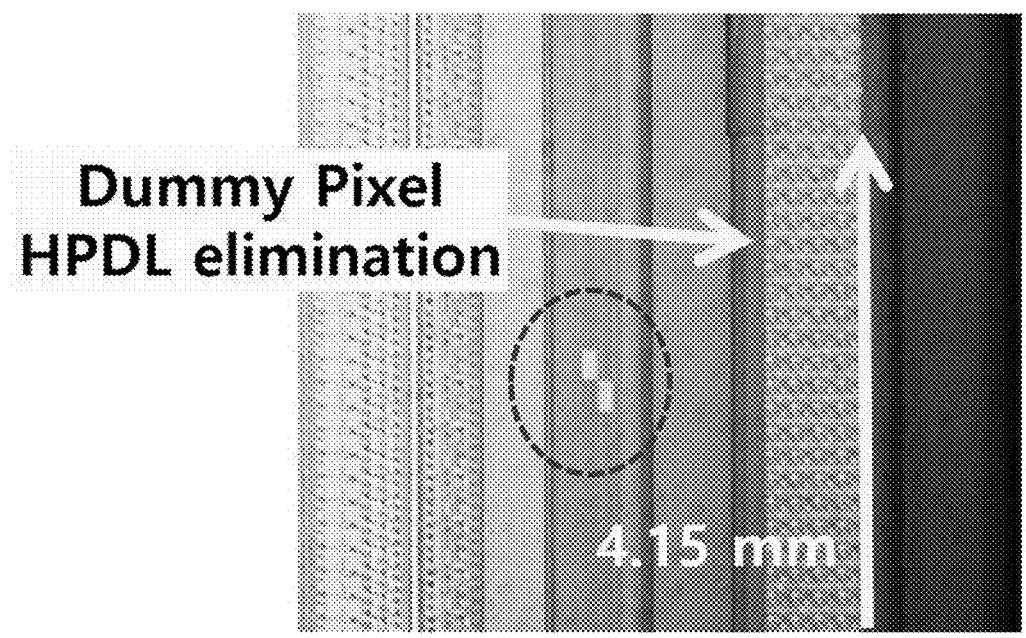
FIG. 17 illustrates an image near a cut plane of the display device according to the embodiment of FIG. 16.

FIG. 17 illustrates an image near a cut plane of the display device according to the embodiment of FIG. 16. Referring to FIG. 17, in the display device according to the embodiment, a width of the second organic film 150 eliminated is about 4.15 nm. In this case, the bubble was completely eliminated, and it was confirmed that the alignment mark indicated by a dotted circle in FIG. 17 was clearly seen without being covered by the bubbles.

Figure 18:
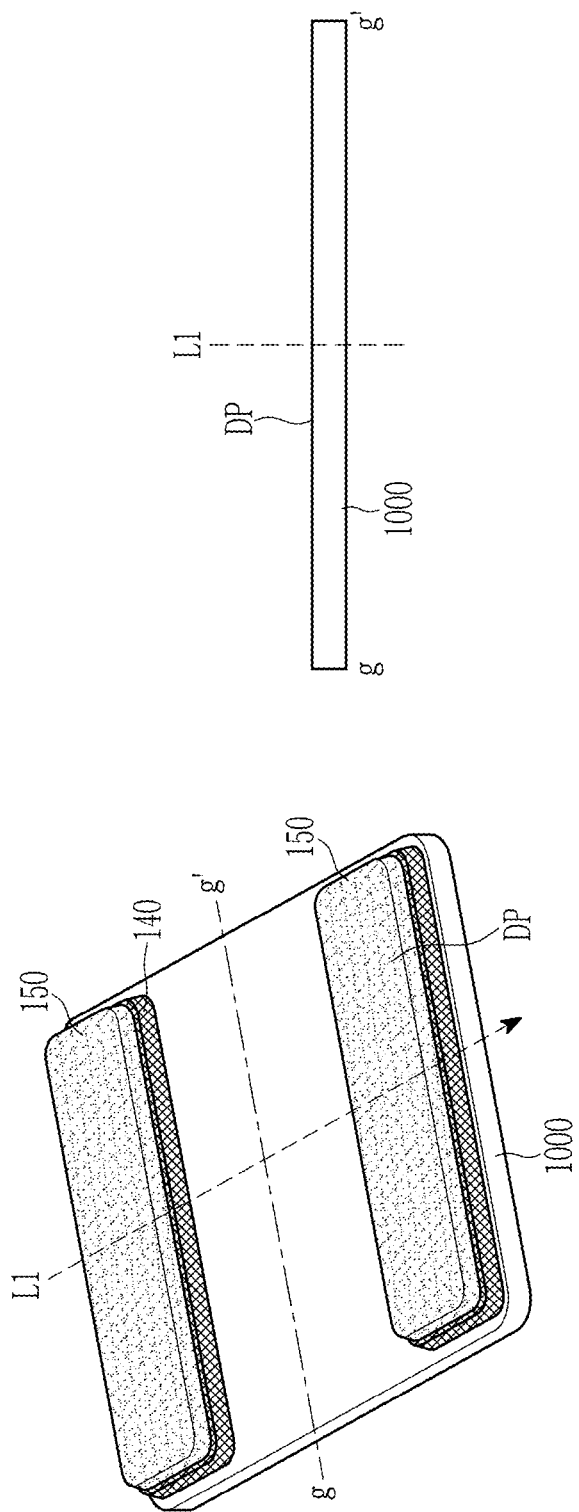
FIG. 18 illustrates the same area as FIG. 16 in another embodiment of the present inventive concept.

FIG. 16 illustrates a structure in which the first organic film 140 is not removed and the second organic film 150 is partially removed, but the first organic film 140 may also be removed. That is, as shown in FIG. 18, when the first organic film 140 is removed, the bubbles may be well discharged.

Figure 19:
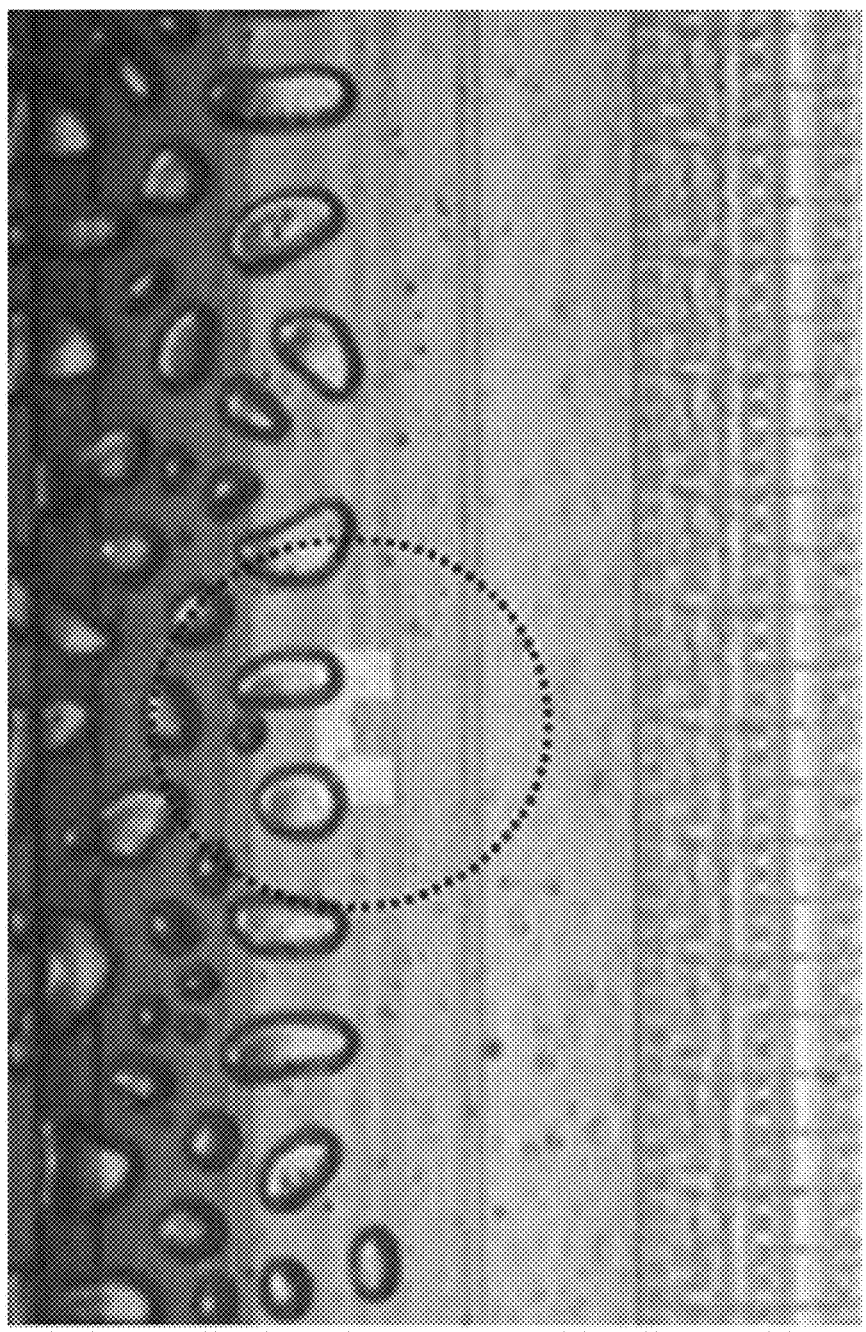
FIG. 19 illustrates an image in which bubbles occur such that an alignment mark is covered according to a comparative example of the present inventive concept.
Figure 20:
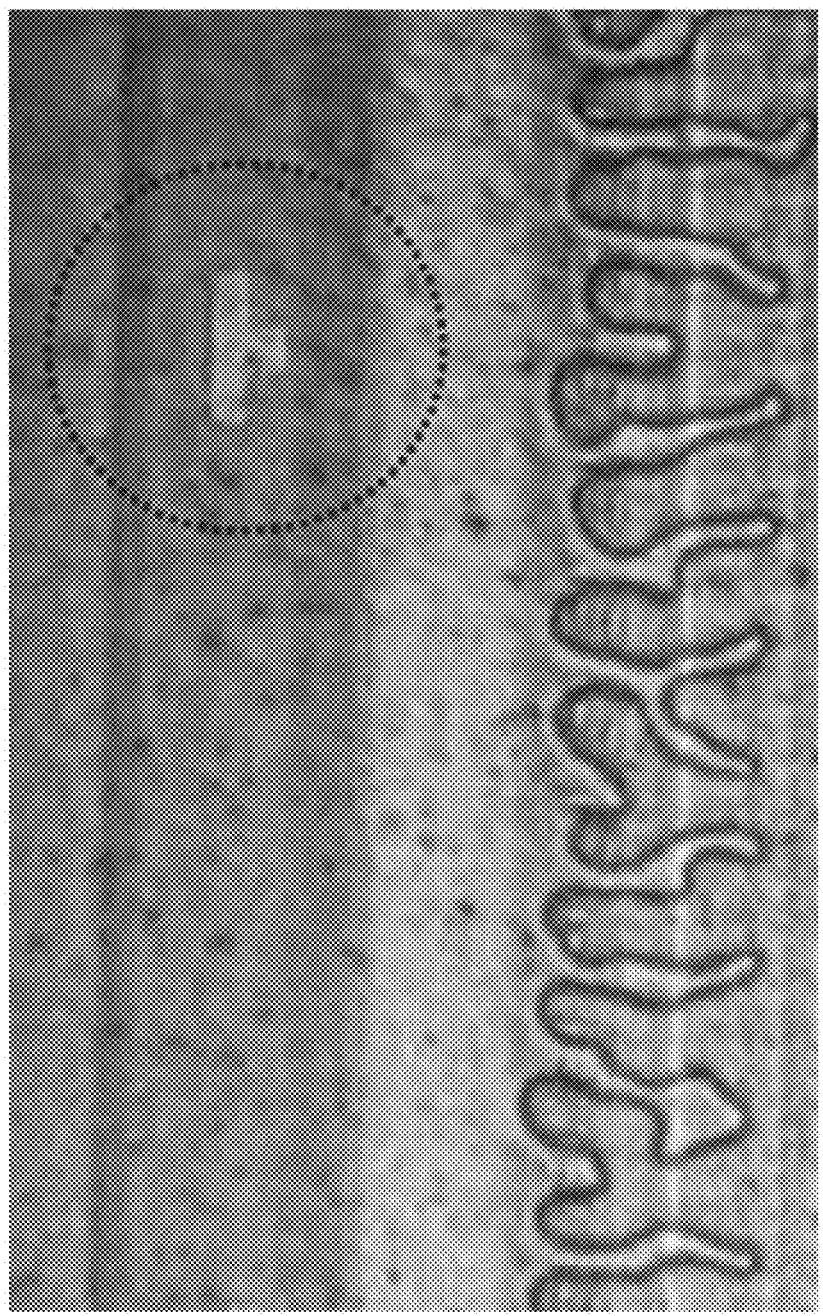
FIG. 20 illustrates an image in which no alignment mark is covered because no bubbles occur according to an embodiment of the present inventive concept.

FIG. 19 illustrates an image in which bubbles occur such that an alignment mark is covered by the bubbles according to a comparative example of the present inventive concept. FIG. 20 illustrates an image in which no alignment mark is covered by the bubbles because no bubbles occur according to an embodiment of the present inventive concept. Comparing FIG. 19 with FIG. 20, it can be seen that in FIG. 19, the alignment mark is covered by the bubbles, so it is hard to be recognized (see the dashed circle portion), but in FIG. 20, there are no bubbles, so the alignment mark is clearly recognized (see the dashed circle portion).

Therefore, in the manufacturing method of the display device according to the present embodiment, it is desirable that the area in which the second organic film 150 is recognized overlaps the alignment mark. When the groove of the dummy pattern DP in which the second organic film 150 is recognized overlaps the alignment mark, it is possible to prevent the alignment mark from being covered by the bubbles because the bubbles are removed through the valley in which the first organic film or the second organic film 150 is removed.

Figure 21:
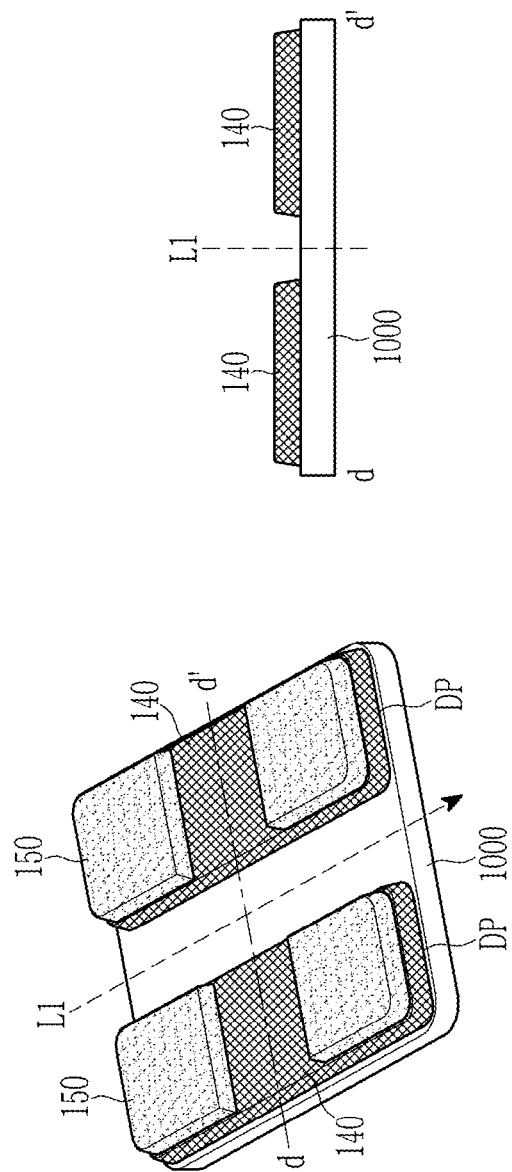
FIG. 21, FIG. 22, FIG. 23, and FIG. 24 illustrate the same region as FIG. 13 in a display device according to another embodiment of the present inventive concept.
Figure 22:
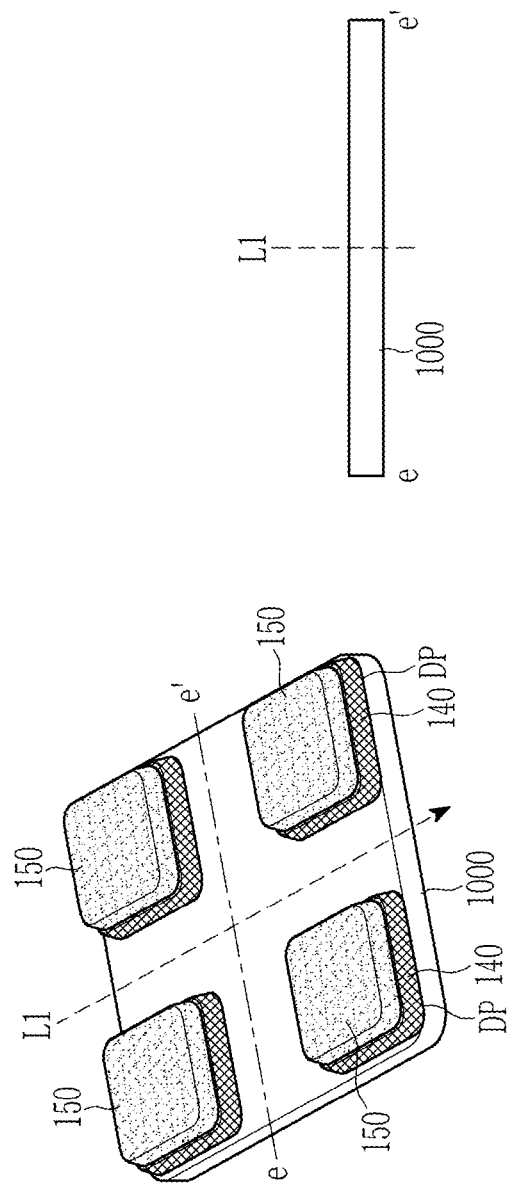
Figure 23:
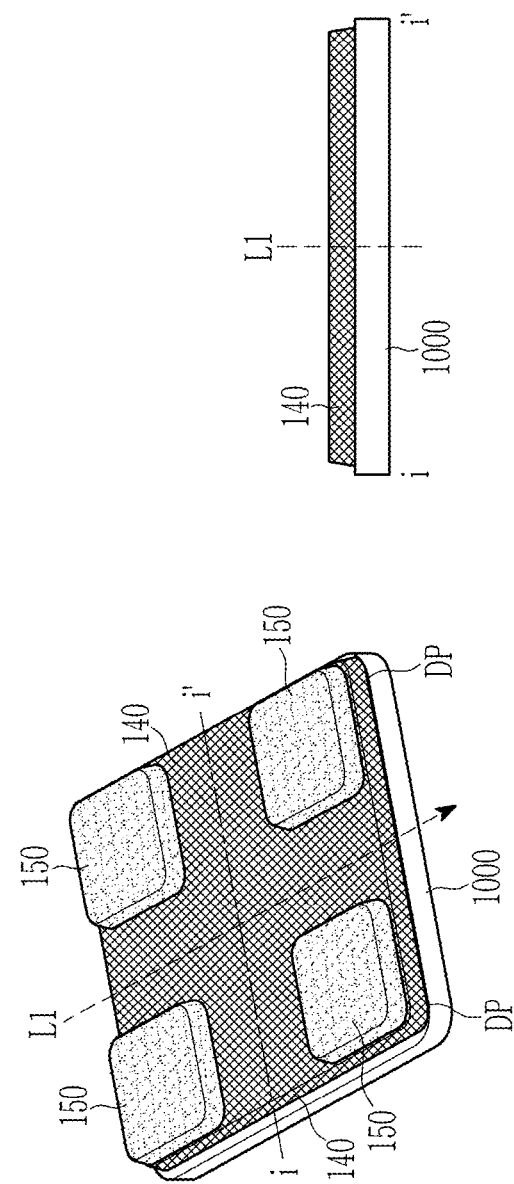

FIG. 21 to FIG. 23 illustrate display devices according to other embodiments. Referring to FIG. 21, the display device according to the present embodiment is the same as the display device according to the embodiment of FIG. 13, except that the first organic film and the second organic film 150 in the dummy pattern DP in an area overlapping the cutting line L1 is also removed. A detailed description of the same components will be omitted.

Referring to the cross-sectional view taken along line d-d' of FIG. 21, when the portion of the second organic film 150 is removed and the first organic film 140 and the second organic film 150 are removed at a portion overlapping the cutting line L1, the bubbles may be more easily removed.

The display device of FIG. 22 is the same as the display device according to the embodiment of FIG. 21, except that both the second organic film 150 and the first organic film 140 are removed along a line e-e' too. In FIG. 22, because both the first organic film 140 and the second organic film 150 are removed in the direction perpendicular to the cutting line L1, the bubbles may be more easily removed.

The embodiment of FIG. 23 is the same as that of FIG. 21 except that the first organic film 140 is not removed at the cutting line L1. A detailed description of the same components will be omitted.

Figure 24:
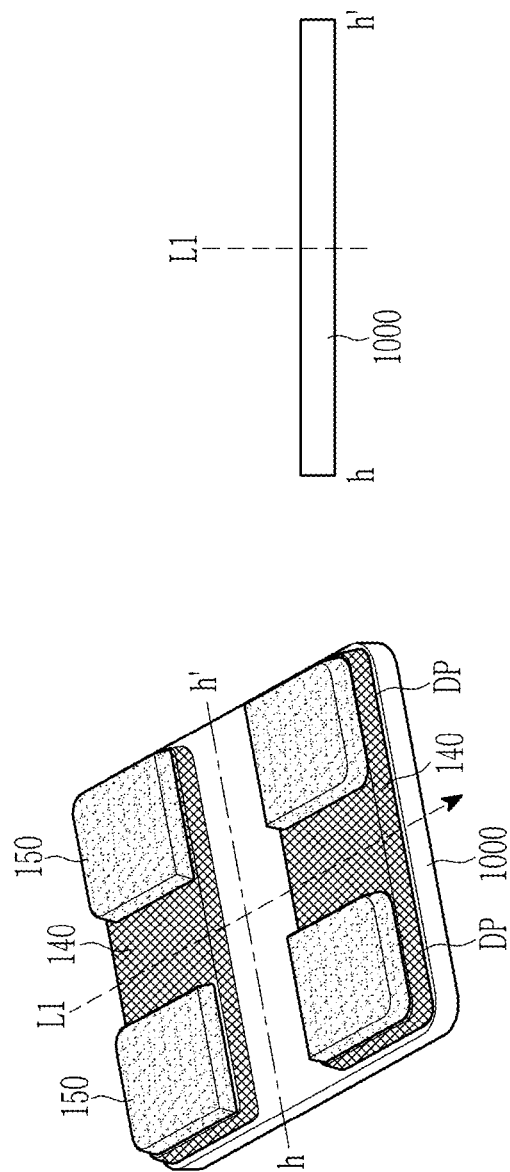

The embodiment of FIG. 24 is the same as that of FIG. 21, except that the first organic film 140 and the second organic film 150 are eliminated in the direction perpendicular to the cutting line L1. In FIG. 24, no organic film is disposed in the passage through which the bubbles are discharged, so that the bubbles may be well discharged.

The protective layer is a structure attached to the rear surface of the substrate 1000 and the dummy pattern DP is a structure disposed on the upper surface of the substrate, but the passage through which the bubbles formed on the rear surface of the substrate 1000 are discharged is affected by the structure disposed on the upper surface. Therefore, when the passage through which the bubbles may be discharged is formed in the dummy pattern DP as in the manufacturing method according to the present embodiment, the bubbles formed when the protective layer is attached on the rear surface of the substrate 1000 may be easily removed.

As described above, according to the display device and the manufacturing method thereof according to the embodiment of the present inventive concept, by increasing the thickness of the mother film 2000 which may be removed during the manufacturing process, it is possible to improve the problem that the mother substrate 1000 and the mother film 2000 are detached from each other to form bubbles between the mother substrate 1000 and the mother film 2000 during the prolonged waiting time in the manufacturing process. In addition, the groove is formed in the dummy pattern near the cutting line in the direction perpendicular to the cutting line, and thus, the passage through which the bubbles formed between the mother substrate 1000 and the rear protective layer may be discharged is formed, so that the bubbles may be effectively removed.

While this inventive concept has been described in connection with what is presently considered to be practical embodiments, it is to be understood that the inventive concept is not limited to the disclosed embodiments, but, on the contrary, is intended to cover various modifications and equivalent arrangements included within the spirit and scope of the appended claims.

What is claimed is:

1. A manufacturing method of a display device, comprising:
    preparing a substrate including a plurality of display modules and a plurality of dummy patterns disposed between the plurality of display modules; and
    cutting the substrate along a cutting line and separating the substrate into individual display modules,
    wherein the plurality of dummy patterns are disposed along a direction parallel to the cutting line, and each of the plurality of dummy patterns is provided with a groove disposed along a direction perpendicular to the cutting line.

2. The manufacturing method of the display device of claim 1, wherein each of the plurality of dummy patterns includes a first organic film and a second organic film disposed on the first organic film, and
    wherein the second organic film is partially removed along a direction perpendicular to the cutting line.

3. The manufacturing method of the display device of claim 2, further comprising an alignment mark disposed on the substrate,
    wherein the second organic film on the align mark is removed.

4. The manufacturing method of the display device of claim 3, wherein the first organic film and the second organic film are removed in a direction perpendicular to the cutting line.

5. The manufacturing method of the display device of claim 1, wherein the plurality of dummy patterns does not overlap the cutting line.

6. The manufacturing method of the display device of claim 1, wherein the plurality of dummy patterns overlaps the cutting line.

7. The manufacturing method of the display device of claim 1, wherein the preparing of the substrate including the plurality of display modules and the plurality of dummy patterns disposed between the display modules includes:
    preparing a mother substrate including a plurality of display modules; and
    attaching a mother film to a rear surface of the mother substrate,
    wherein the mother film includes a first layer and a second layer disposed between the first layer and the mother substrate, and
    wherein the second layer includes a pressure-sensitive adhesive (PSA), and a thickness of the second layer is from about 40 μm to about 60 μm.

8. The manufacturing method of the display device of claim 7, further comprising:
    after the cutting of the substrate along the cutting line to separate the substrate into individual display modules, eliminating the mother film, and
    attaching a protective layer to a rear surface of the substrate.

* * * * *